United States Patent
Hsu

(10) Patent No.: US 7,419,945 B2
(45) Date of Patent: Sep. 2, 2008

(54) MICROELECTRONIC CLEANING COMPOSITIONS CONTAINING OXIDIZERS AND ORGANIC SOLVENTS

(75) Inventor: Chien-Pin Sherman Hsu, Basking Ridge, NJ (US)

(73) Assignee: Mallinckrodt Baker, Inc., Phillipsburg, NJ (US)

( * ) Notice: Subject to any disclaimer, the term of this patent is extended or adjusted under 35 U.S.C. 154(b) by 194 days.

(21) Appl. No.: 10/515,392

(22) PCT Filed: May 27, 2003

(86) PCT No.: PCT/US03/16828

§ 371 (c)(1),
(2), (4) Date: Nov. 22, 2004

(87) PCT Pub. No.: WO03/104900

PCT Pub. Date: Dec. 18, 2003

(65) Prior Publication Data

US 2005/0239673 A1    Oct. 27, 2005

(51) Int. Cl.
*G03F 7/42* (2006.01)

(52) U.S. Cl. .................. 510/175; 510/176; 510/255

(58) Field of Classification Search .............. 510/175, 510/176, 255
See application file for complete search history.

(56) References Cited

U.S. PATENT DOCUMENTS

| | | | | |
|---|---|---|---|---|
| 3,673,099 A | | 6/1972 | Corby et al. | |
| 3,738,881 A | * | 6/1973 | Erdman et al. | 438/752 |
| 4,113,551 A | * | 9/1978 | Bassous et al. | 438/753 |
| 4,119,399 A | * | 10/1978 | Feinland et al. | 8/412 |
| 4,744,834 A | | 5/1988 | Haq | |
| 5,002,687 A | * | 3/1991 | Roberts et al. | 510/306 |
| 5,037,724 A | | 8/1991 | Maeda et al. | 430/331 |
| 5,308,745 A | * | 5/1994 | Schwartzkopf | 430/329 |
| 5,445,756 A | * | 8/1995 | Didier et al. | 510/303 |
| 5,498,293 A | * | 3/1996 | Ilardi et al. | 134/3 |
| 5,705,089 A | * | 1/1998 | Sugihara et al. | 252/79.1 |
| 5,885,362 A | * | 3/1999 | Morinaga et al. | 134/2 |
| 5,911,836 A | * | 6/1999 | Hada et al. | 134/2 |
| 5,989,353 A | * | 11/1999 | Skee et al. | 134/2 |
| 5,993,685 A | * | 11/1999 | Currie et al. | 252/79.1 |
| 6,323,169 B1 | * | 11/2001 | Abe et al. | 510/176 |
| 6,465,403 B1 | * | 10/2002 | Skee | 510/175 |
| 6,585,825 B1 | * | 7/2003 | Skee | 134/3 |
| 2002/0066465 A1 | * | 6/2002 | Gotoh et al. | 134/2 |
| 2002/0077259 A1 | * | 6/2002 | Skee | 510/175 |
| 2002/0128164 A1 | * | 9/2002 | Hara et al. | 510/175 |

FOREIGN PATENT DOCUMENTS

| | | | |
|---|---|---|---|
| EP | 1039518 A1 | * | 9/2000 |
| JP | 60203944 A | * | 10/1985 |

* cited by examiner

*Primary Examiner*—Gregory E Webb
(74) *Attorney, Agent, or Firm*—George Rauchfauss, Jr.; Ohlandt, Greeley, Ruggiero, & Perle, L.L.P.

(57) ABSTRACT

Cleaning compositions suitable for cleaning microelectronic structures having silicon dioxide, low-k or high-k dielectrics and copper or aluminum metallizations contain an oxidizing agent and a polar organic solvent selected from amides, sulfones, sulfolenes, selenones and saturated alcohols, and optionally other components.

9 Claims, No Drawings

MICROELECTRONIC CLEANING COMPOSITIONS CONTAINING OXIDIZERS AND ORGANIC SOLVENTS

FIELD OF THE INVENTION

This invention relates to methods and cleaning compositions for cleaning microelectronic substrates, and particularly to such cleaning compositions useful with and having improved compatibility with microelectronic substrates characterized by silison dioxide, sensitive low-κ or high-κ dielectrics and copper metallization, as well as substrates of Al or Al(Cu) metallizations. The invention also relates to the use of such cleaning compositions for stripping photoresists, cleaning residues from plasma process generated organic, organometallic and inorganic compounds, cleaning residues from planarization processes such as chemical mechanical polishing (CMP), and used as an additive in planarization slurry residues.

BACKGROUND TO THE INVENTION

Many photoresist strippers and residue removers have been proposed for use in the microelectronics field as downstream or back end of the manufacturing line cleaners. In the manufacturing process a thin film of photoresist is deposited on a wafer substrate, and then circuit design is imaged on the thin film. Following baking, the unpolymerized resist is removed with a photoresist developer. The resulting image is then transferred to the underlying material, which is generally a dielectric or metal, by way of reactive plasma etch gases or chemical etchant solutions. The etch gases or chemical etchant solutions selectively attack the photoresist-unprotected area of the substrate.

Additionally, following the termination of the etching step, the resist mask must be removed from the protected area of the wafer so that the final finishing operation can take place. This can be accomplished in a plasma ashing step by the use of suitable plasma ashing gases or wet chemical strippers. Finding a suitable cleaning composition for removal of this resist mask material without adversely affecting, e.g., corroding, dissolving or dulling, the metal circuitry has also proven problematic.

As microelectronic fabrication integration levels have increased and patterned microelectonic device dimensions have decreased, it has become increasingly common in the art to employ copper metallizations, low-κ and high-κ dielectrics. These materials have presented additional challenges to find acceptable cleaner compositions. Many process technology compositions that have been previously developed for "traditional" or "conventional" semiconductor devices containing Al/SiO$_2$ or Al(Cu)SiO$_2$ structures cannot be employed with copper metallized low-κ or high-κ dielectric structures. For example, hydroxylamine based stripper or residue remover compositions are successfully used for cleaning devices with Al metallizations, but are practically unsuitable for those with copper metallizations. Similarly, many copper metallized/low-κ strippers are not suitable for Al metallized devices unless significant adjustments in the compositions are made.

Removal of these etch and/or ash residues following the plasma etch and/or ashing process has proved problematic, particularly for substrates having low-κ dielectric materials and those metallized with copper. Failure to completely remove or neutralize these residues can result in the absorption of moisture and the formation of undesirable materials that can cause corrosion to the metal structures. The circuitry materials are corroded by the undesirable materials and produce discontinuances in the circuitry wiring and undesirable increases in electrical resistance.

Heretofore, oxidizers have been used in cleaning compositions in primarily aqueous form. Oxidizers, such as the commonly used hydrogen peroxide and peracids, are known to react readily or decompose easily, especially in organic solvent matrices that have been generally employed in stripping compositions. In such instances the oxidizing agent is consumed and becomes unavailable for its intended use. Additionally, microelectronic cleaning composiitions containing oxidizers often show poor product stability, especially in the presence of significant amounts of 10 wt % or more of organic solvents, and at higher pH ranges and high process temperatures. Furthermore, in many compositions the use of stabilizers and solvents often tie up the oxidizing agent resulting in diminished capabilities of performing effective oxidation/reduction reactions employed in the cleaning process.

BRIEF SUMMARY OF THE INVENTION

There is, therefore, a need for microelectronic cleaning compositions suitable for back end cleaning operations which compositions are effective cleaners and are applicable for stripping photoresists and cleaning residues from plasma process generated organic, organometallic and inorganic compounds, cleaning residues from planarization processes, such as CMP, and useful as additives in planarization slurry/liquids and which can be used for advanced interconnect materials employing copper metallizations, and porous or non-porous low-κ (i.e., a κ value of 3 or less) or high-κ (i.e., a κ value of 20 or greater) dielectrics as well as useful for cleaning conventional devices, such as those with aluminum or aluminun (copper) metallizations containing silicon dioxide, low-κ or high-κ dielectrics. This invention relates to oxidizing agent containing cleaning compositions that are effective cleaners for cleaning all such devices.

It has been discovered that formulations containing oxidizing agents and certain polar organic solvents that are minimally or non-reactive with the oxidizing agents and especially those solvents which help to stabilize the oxidizing agents can provide such widely acceptable cleaning compositions. It has been discovered that solvents with good hydrogen bonding capability provide such oxidizing agent containing formulations. The cleaning composition of this invention will generally have from about 0.1 to about 30 wt % of oxidizing agent and from about 1 to about 99.9 wt % of the organic polar solvent with good hydrogen bonding capability. The cleaning compositions of this invention can also optionally contain water and/or compatible acids or alkaline bases, chelating agents, co-solvents, oxidizing agent stabilizing agents, metal corrosion inhibitors, surfactants, and fluoride compounds. Although an alkaline base is an optional ingredient in the cleaning compositions of this invention, it is preferred that an alkaline base be present since it is preferred, although not essential, that the cleaning compositions have an alkaline pH. The alkaline base can be present in an amount of from 0 to about 30 wt %, preferably in an amount of from about 0.1 to about 10 wt %. The wt percentages provided in this specification are based on the total weight of the cleaning composition.

DETAILED DESCRIPTION OF THE INVENTION AND PREFERRED EMBODIMENTS

The novel back end cleaning composition of this invention will comprise one or more of any oxidizing agent and polar organic solvents. The cleaning compositions can be formulated into highly aqueous, semi-aqueous or organic solvent based formulations. The cleaning compositions can be used alone with other solvents only, or can be combined with bases and acids. The cleaning compositions of this invention can be used over a wide range of process/operating conditions of pH and temperature, and can be used to effectively remove photoresists, post plasma etch/ash residues, sacrificial light absorbing materials and anti-reflective coatings (ARC). Additionally, it has been discovered that very difficult to clean samples, such as highly crosslinked or hardened photoresists and structures which contain titanium (such as titanium, titanium oxide and titanium nitride) or tantalums (such as tantalum, tantalum oxide and tantalum nitride) can be readily cleaned with the cleaning compositions of this invention.

The compositions of the invention can contain any oxidizing agent suitable for use in microelectronic cleaning compositions. As examples of such oxidizing agents there may be mentioned, for example, peroxides, particularly hydrogen peroxide, molecular adducts of peroxyhydrates from hydrogen peroxides and oxyacids, zirconyl acetate and azo compounds, e.g., sodium percarbonate, sodium perborates, as well as periodates ($IO_4^-$), perborates, permanganates ($MnO_4^-$), hydrogen persulfates, persulfates and alkyloxyhalides, for example t-BuOCl. Other peroxy compounds from substitution reactions of $H_2O_2$ and organic molecules may be employed but are less preferred. Examples include alkylperoxides, peroxyacids, diacyl peroxides and ketone peroxides. Similar substitution products of $H_2O_2$ with inorganic molecules, such as peroxysulfuric acid, may also be employed. The oxidizing agent is employed in the cleaning compositions of this invention in an amount of from about 0.1 to about 30 wt %, preferably from about 0.1 to about 5 wt %, and most preferably in an amount of from about 1 to about 5 wt %. The preferred oxidizing agent is hydrogen peroxide ($H_2O_2$), preferably employed as a 3 to 30% aqueous solution.

The organic solvent is a polar organic solvent with hydrogen bonding capability and which is minimally or non-reactive with the oxidizing agent. Such organic solvents include amides, sulfones, sulfolenes, selenones, and saturated alcohols. Among the preferred solvents there may be mentioned sulfolane (tetrahydrothiopene-1,1-dioxide), 3-methylsulfolane, n-propyl sulfone, n-butyl sulfone, sulfolene (2,5-dihydrothiopene-1,1-dioxide), 3-methylsulfolene, amides such as 1-(2-hydroxyethyl)-2-pyrrolidinone (HEP), dimethylpiperidone (DMPD), N-methylpyrrolidinone (NMP), and dimethylacetamide (DMAc), dimethylformamide (DMF), and saturated alcohols such as ethanol, propanol, butanol, hexanol, ethylene glycol, propylene glycol, glycerol, and hexafluoroisopropanol. The organic solvent component can include one or more of the solvents and is generally present in the composition in an amount of from about 1 to about 99.9 wt %, preferably in an amount of from about 10 to about 90 wt %, and most preferably in an amount of from about 30 to 80 wt %. These solvents are resistant to acidic and alkaline conditions and will not bind the oxidizing agent too tightly. Additionally, they are capable of stabilizing the oxidizing agent, such as hydrogen peroxide, by forming stable complexes through interaction such as hydrogen bonding.

Water can be present in the cleaning composition and when present can be present in an amount of from about 0.1 to about 98 wt %, preferably in an amount of from about 10 to about 60 wt %, most preferably in an amount of from about 15 to about 50 wt %. The water can be present as part of the aqueous portion of the other components and/or as additional added water.

The alkaline base is present as an optional, but generally preferred component of the cleaning compositions of this invention. The alkaline base can be present In an amount of from 0 to about 30 wt %, preferably in an amount of from about 0.1 to about 10 wt %, most preferably in an amount of from about 0.1 to about 5 wt %. Any suitable alkaline base may be employed in the cleaning compositions. The base is preferably ammonia hydroxide or an ammonia or non-ammonia derived base. When the composition is intended to be used to clean copper metallized structures the base is preferably a non-ammonia derived base and when the composition is intended to be used to clean aluminum containing structures the alkaline base is preferably ammonium hydroxide, a ammonia derived base, or a non-ammonia derived base in combination with a corrosion-inhibiting co-solvent and/or corrosion-inhibiting agent, as disclosed hereinafter. As examples of suitable non-ammonia derived bases there may be mentioned tetraalkylammonium hydroxides such as those of the formula $R_4N^+OH^-$ where each R is independently a substituted or unsubstituted alkyl groups, preferably of 1 to 22 carbon atoms and more preferably 1 to 4 carbon atoms. Among the non-ammonia derived alkaline bases useful in the compositions there may be mentioned, for example, tetramethylammonium hydroxide, tertrabutylammonium hydroxide, choline hydroxide, and the like. Inorganic bases such as for example potassium hydroxide, sodium hydroxide and the like may also be used as the alkaline base.

An indicated before, the cleaning composition of this invention can also be employed under acid pH conditions and any suitable acid component can be employed in the necessary amount sufficient to provide the acidic pH to the composition, such as for example HCl or HF.

The cleaning composition may also optionally include one or more corrosion-inhibiting co-solvents. Preferred corrosion-inhibiting co-solvents useful in the compositions of this invention are those of the general formula

where $R_1$ and $R_2$ are each independently selected from H, alkyl, preferably alkyl of from 1 to 6 carbon atoms, aryl, preferably aryl of from 3 to 14 carbon atoms, $OR_3$ and $SO_2R_4$; n is a numeral of from 2 to 6, preferably 2 or 3; W and Y are each independently selected from $OR_3$, and $SO_2R_4$; and $R_3$ and $R_4$ are each independently selected from H, alkyl, preferably alkyl of from 1 to 6 carbon atoms, and aryl, preferably aryl of from 3 to 14 carbon atoms. As examples of such corrosion-inhibiting co-solvents there may be mentioned, for example, ethylene glycol, propylene glycol and glycerol and the like. If the required polar organic solvent component of the cleaning composition is not a saturated alcohol within the above-mentioned formula, such a saturated alcohol may be present as a co-solvent. The co-solvents may be present in the composition in an amount of from 0 to about 80 wt %, preferably from about 1 to about 50 wt %, most preferably from about 1 to 30 wt %.

The compositions of this invention may also contain other corrosion-inhibiting agents, preferably aryl compounds containing two or more OH, $OR_6$, and/or $SO_2R_6R_7$ groups bonded directly to the aromatic ring, where $R_6$, $R_7$ and $R_8$ are each independently alkyl, preferably alkyl of from 1 to 6 carbon atoms, or aryl, preferably aryl of from 6 to 14 carbon atoms. As examples of such preferred corrosion-inhibiting agents there may be mentioned catechol, pyrogallol, gallic acid, resorcinol and the like. Such other corrosion-inhibiting agents may be present in an amount of from 0 to about 15 wt %, preferably from about 0.1 to about 10 wt %, most preferably from about 0.5 to about 5 wt %.

Organic or inorganic chelating or metal complexing agents are not required, but offer substantial benefits, such as for example, improved product stability. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties [e,g. ethylenediamine tetra(methylene phosphonic acid) (EDTMP), diethylenetriamine penta(methylene phosphonic acid), triethylenetetramine hexa(methylene phosphonic acid). The chelating agent will be present in the composition in an amount of from 0 to about 5 wt %, preferably from about 0.1 to about 2 wt %. Metal chelating or complexing agents of various phosphonates, such as ethylenediamine tetra(methylene phosphonic acid) (EDTMP) offer much improved stabilization of the cleaning compositions of the cleaning compositions of this invention containing oxidizing agents at acidic and alkaline conditions and thus are generally preferred.

Other stabilizers for oxidizing agents can also be employed in the cleaning compositions of this invention if desired. These stabilizers may be employed in an amount ranging from 0 to about 10 wt %, preferably from about 0.1 to 5 wt %. Examples of such stabilizer include but are not limited to acetanilide and silicates, preferably metal ion-free silicates such as tetraalkylammonium silicates (including hydroxy- and alkoxy alkyl groups) where the alkyl group, preferably contains from 1 to 4 carbon atoms. Among such silicates are tetraethylorthosilicate, tetramethylammonium silicate, tetrakis(2-hydroxyethyl) orthosilicate and the like.

Optional: other metal corrosion inhibitors, such as benzotriazole, may be employed in an amount of from 0 to about 5 wt %, preferably from about 0.1 to 2 wt %.

The cleaning compositions optionally may also contain surfactants, such as for example dimethyl hexynol (Surfynol-61), ethoxylated tetramethyl decynediol (Surfynol-465), polytetrafluoroethylene cetoxypropylbetaine (Zonyl FSK), Zonyl FSH and the like. The surfactant will generally be present in an amount of from 0 to about 5 wt %, preferably 0.1 to about 3 wt %.

The cleaning compositions may also optionally contain fluoride compounds in cleaning composition, such as for example, tetramethylammonium fluoride, tetrabutylammonium fluoride, and ammonium fluoride. Other suitable fluorides include, for example fluoroborates, tetrabutylammonium fluoroborates, aluminum hexafluorides, antimony fluoride and the like. The fluoride components will be present in an amount of from 0 to 10 wt %, preferably from about 0.1 to 5 wt %.

Examples of cleaning composition of this invention set forth in the following Tables 1 to 9.

In the following Tables the abbreviations employed are as follows.

HEP=1-(2-hydroxyethyl)-2-pyrrolidinone
TMAH=tetramethylammonium hydroxide
TMAF=tetramethylammonium fluoride
ACA=acetanilide
CyDTA=trans-1,2-cyclohexanediamine tetraacetic acid
TEOS=tetraethylorthosilicate
DMPD=dimethylpiperidone
SFL=sulfolane
TMAS=tetramethylammonium silicate
EG=ethylene glycol
CAT=catechol
EHDP=ethane-1-hydroxy-1,1-diphosphonate
EDTMP=ethylenediamine tetra(methylene phosphonic acid)
1N HCl=1 normal hydrochloric acid
NH$_4$OH=ammonium hydroxide
CH=choline hydroxide
Water=additional water over water from aqueous solution of components.

Also in the following Tables the compositions XM-188, XM-188A and XM-191 refer to the following compositions in which the listed components are present in the parts by weight indicated in the parenthesis.

XM-188=SFL (300), Water (75), 25% TMAH (25), CyDTA (2.3)
XM-188A=SFL (150), Water (60), 25% TMAH (17.5), EDTMP (1.8)
XM-191=SFL (150), Water (60), 25% TMAH (17.5), EDTMP (1.8), EG (30)

TABLE 1

| | Compositions/Parts by Weight | | | | | | |
|---|---|---|---|---|---|---|---|
| Component | A | B | C | D | E | F | G |
| HEP | 30 | 30 | 30 | 30 | | 60 | |
| 25% TMAH | 2 | 2.6 | 2 | 2 | 2 | 5 | 5 |
| ACA | 0.2 | 0.2 | | | | | |
| CyDTA | | 0.2 | | | | 0.4 | 0.4 |
| TEOS | | | 1 | | | | |
| DMPD | | | | | 30 | | 60 |
| SFL | | | | | | | |
| EG | | | | | | | |
| CAT | | | | | | | |
| 60% EHDP | | | | | | | |
| EDTMP | | | | | | | |
| TMAF | | | | | | | |
| 10% TMAS | | | | | | | |
| 29% NH$_4$OH | | | | | | | |
| 30% H$_2$O$_2$ | 2.5 | 2.5 | 2.5 | 2.5 | 2.5 | 5 | 5 |
| Water | 15 | 15 | 15 | 15 | 15 | 30 | 30 |
| XM-188 | | | | | | | |
| XM-188A | | | | | | | |
| XM-191 | | | | | | | |
| 1N HCl | | | | | | | |
| 20% CH | | | | | | | |

TABLE 2

| | Compositions/Parts by Weight | | | | | | |
|---|---|---|---|---|---|---|---|
| Component | H | I | J | K | L | M | N |
| HEP | 30 | | | | | | |
| 25% TMAH | 1 | 10 | 8.8 | | 4 | 3 | 4.9 |
| ACA | | | | | | | |
| CyDTA | | 0.92 | | | 0.35 | | 0.24 |
| TEOS | | | | | | | |
| DMPD | | | | | | | |
| SFL | | 120 | | | 50 | 30 | 37 |
| EG | | | | | 10 | | |
| CAT | | | | | | | |
| 60% EHDP | | | | | | 0.24 | 0.29 |
| EDTMP | | | | | | | |
| TMAF | | | | | | | |
| 10% TMAS | 1 | | | | | | |
| 29% NH$_4$OH | | | | | | | |
| 30% H$_2$O$_2$ | 2 | 10 | 8.8 | 2.5 | 4.2 | 2.5 | 4 |
| Water | 15 | 60 | | | | | 9 |
| XM-188 | | | 40 | 40 | | | |
| XM-188A | | | | | | | |

TABLE 2-continued

Compositions/Parts by Weight

| Component | H | I | J | K | L | M | N |
|---|---|---|---|---|---|---|---|
| XM-191 | | | | | | | |
| 1N HCl | | | | | | | |
| 20% CH | | | | | | | |

TABLE 3

Compositions/Parts by Weight

| Component | O | P | Q | R | S | T | U |
|---|---|---|---|---|---|---|---|
| HEP | | | | | | | |
| 25% TMAH | 5 | 20 | 4.4 | | 7.8 | | |
| ACA | | | | | | | |
| CyDTA | | | | | | | |
| TEOS | | | | | | | |
| DMPD | | | | | | | |
| SFL | | 200 | 37.5 | | 42.5 | | |
| EG | | | | | | 10.3 | 15 |
| CAT | | | | | | | |
| 60% EHDP | 1.5 | 2.6 | | | | | |
| EDTMP | | | 0.68 | | | | |
| TMAF | | | | | | | 2 |
| 10% TMAS | | | | | | | |
| 29% NH$_4$OH | | | | | | | |
| 30% H$_2$O$_2$ | 19.2 | 18.7 | 4.8 | 5 | 4.3 | | 5 |
| Water | 20 | 70 | 22.5 | | 10.6 | 3.5 | |
| XM-188 | 200 | | | | | 40 | |
| XM-188A | | | | 57.4 | | | 40 |
| XM-191 | | | | | | | |
| 1N HCl | | | | | | | |
| 20% CH | | | | | | | |

TABLE 4

Compositions/Parts by Weight

| Component | V | W | X | Y | Z | AA | BB |
|---|---|---|---|---|---|---|---|
| HEP | | | | | | | |
| 25% TMAH | | | | | | | |
| ACA | | | | | | | |
| CyDTA | 0.39 | | | | 0.39 | | |
| TEOS | | | | | | | |
| DMPD | | | | | | | |
| SFL | 50 | | | 50 | 50 | 50 | 40 |
| EG | | 15 | 15 | | | | |
| CAT | | 3 | | | 3.5 | 3.5 | 1.5 |
| 60% EHDP | | | | | | | |
| EDTMP | | | | 0.6 | | 0.6 | 0.6 |
| TMAF | | | | | | | |
| 10% TMAS | | | | | | | |
| 29% NH$_4$OH | 1.4 | | | 1.9 | 1.4 | 1.9 | 2 |
| 30% H$_2$O$_2$ | 6.4 | 5.8 | 5.5 | 7.2 | 6.7 | 6.7 | 7.6 |
| Water | 12.5 | | | 20 | 12.5 | 20 | 30 |
| XM-188 | | 40 | 40 | | | | |
| XM-188A | | | | | | | |
| XM-191 | | | | | | | |
| 1N HCl | | | | | | | |
| 20% CH | | | | | | | |

TABLE 5

Compositions/Parts by Weight

| Component | CC | DD | EE | FF | GG | HH | II |
|---|---|---|---|---|---|---|---|
| HEP | | | | | | | |
| 25% TMAH | | | 2 | | | | |
| ACA | | | | | | | |
| CyDTA | 0.39 | | | | | | |
| TEOS | | | | | | | |
| DMPD | | | | | | | |
| SFL | 50 | 50 | | | 60 | | 60 |
| EG | | | | | | 50 | |
| CAT | | | | | | | |
| 60% EHDP | | | | | | | |
| EDTMP | | 0.6 | | | | | |
| TMAF | | | | | | | |
| 10% TMAS | | | | | | | |
| 29% NH$_4$OH | 1.7 | 2.2 | | | | | |
| 30% H$_2$O$_2$ | 7 | 7.3 | 5 | 5 | 5 | 6.2 | 2.5 |
| Water | 12.5 | 20 | | | | | |
| XM-188 | | | | | | | 40 |
| XM-188A | | | 57 | | | | |
| XM-191 | | | | | | | |
| 1N HCl | | | | | | | 1 |
| 20% CH | | | | | | | |

TABLE 6

Compositions/Parts by Weight

| Component | JJ | KK | LL | MM | NN | OO |
|---|---|---|---|---|---|---|
| HEP | | | | | | |
| 25% TMAH | 5 | 5 | 6 | | 5 | 6 |
| ACA | | | | | | |
| CyDTA | | | | | | |
| TEOS | | | | | | |
| DMPD | | | | | | |
| SFL | | | | | | |
| EG | | | | | | |
| CAT | | | | | | |
| 60% EHDP | | | | | | |
| EDTMP | | | | | | |
| TMAF | | | | | | |
| 10% TMAS | | | | | | |
| 29% NH$_4$OH | | | | | | |
| 30% H$_2$O$_2$ | 7 | 7.5 | 6 | 2.5 | 7 | 6 |
| Water | | 5 | | | | |
| XM-188 | | | 80 | 40 | | 80 |
| XM-188A | | | | | | |
| XM-191 | 62.5 | 64.5 | | | 62.5 | |
| 1N HCl | | | | | | 1 |
| 20% CH | | | | | | |

TABLE 7

Compositions/Parts by Weight

| Component | PP | QQ | RR | SS | TT | UU | VV |
|---|---|---|---|---|---|---|---|
| HEP | | | | | | | |
| 25% TMAH | 25 | 25 | 20 | 25 | 17.5 | 17.5 | 2.5 |
| ACA | | | | | | | |
| CyDTA | 3 | 3 | 2.5 | 1.5 | | | 0.23 |
| TEOS | | | | | | | |
| DMPD | | | | | | | |
| SFL | 300 | 300 | 300 | 300 | 150 | 150 | 30 |
| EG | 5 | | | | 40 | 20 | 15 |
| CAT | | | | | | | 3 |
| 60% EHDP | | | | | | | |
| EDTMP | | | | | 1.8 | 1.8 | |
| TMAF | | | | | | | |
| 10% TMAS | | | | | | | |
| 29% NH$_4$OH | | | | | | | |
| 30% H$_2$O$_2$ | 36.8 | 37.3 | 36.7 | 37.2 | 26 | 24 | 5.8 |
| Water | 35 | 45 | 45 | 45 | 50 | 50 | 7.5 |
| XM-188 | | | | | | | |
| XM-188A | | | | | | | |

TABLE 7-continued

| | Compositions/Parts by Weight | | | | | | |
|---|---|---|---|---|---|---|---|
| Component | PP | QQ | RR | SS | TT | UU | VV |
| XM-191 | | | | | | | |
| 1N HCl | | | | | | | |
| 20% CH | | | | | | | |

TABLE 8

| | Compositions/Parts by Weight | | | | | | |
|---|---|---|---|---|---|---|---|
| Component | WW | XX | YY | ZZ | AAA | BBB | CCC |
| HEP | | | | | | | |
| 25% TMAH | | | | | 3.1 | 7.5 | |
| ACA | | | | | | | |
| CyDTA | 0.39 | | 0.39 | | 0.28 | 1.2 | 0.8 |
| TEOS | | | | | | | |
| DMPD | | | | | | 7.5 | |
| SFL | 50 | 50 | 50 | 50 | 74 | | 75 |
| EG | | | | | | | |
| CAT | 3.5 | 3.5 | | | | | |
| 60% EHDP | | | | | | | |
| EDTMP | | 0.6 | | 0.6 | | | |
| TMAF | | | | | | | |
| 10% TMAS | | | | | | | |
| 29% NH₄OH | 1.4 | 1.9 | 1.4 | 1.9 | | | |
| 30% H₂O₂ | 6.8 | 7.6 | 6.4 | 7.25 | 14.7 | 13.6 | 14 |
| Water | 12.5 | 20 | 12.5 | 20 | 40 | 25 | 25 |
| XM-188 | | | | | | | |
| XM-188A | | | | | | | |
| XM-191 | | | | | | | |
| 1N HCl | | | | | | | |
| 20% CH | | | | | | | 12 |

TABLE 9

| | Compositions/Parts by Weight | |
|---|---|---|
| Component | DDD | EEE |
| HEP | | 75 |
| 25% TMAH | 6.25 | 7.5 |
| ACA | | |
| CyDTA | 0.6 | 1.2 |
| TEOS | | |
| DMPD | | |
| SFL | | |
| EG | 75 | |
| CAT | | |
| 60% EHDP | | |
| EDTMP | | |
| TMAF | | |
| 10% TMAS | | |
| 29% NH₄OH | | |
| 30% H₂O₂ | 13.4 | 13.6 |
| Water | 25 | 25 |
| XM-188 | | |
| XM-188A | | |
| XM-191 | | |
| 1N HCl | | |

The copper and aluminum etch rate for cleaning compositions of this invention are demonstrated by the etch rate data in the following Table 10. The etch rate was determined utilizing the following test procedure.

Pieces of aluminum or copper foil of approximately 13×50 mm were employed. The thickness of the foil pieces was measured. After cleaning the foil pieces with 2-propanol, distilled water and acetone and the foil pieces are dried in a drying oven. The cleaned, dried foil pieces were then placed in loosely capped bottles of preheated cleaning compositions of the invention and placed in a vacuum oven for a period of from two to four hours at the indicated temperature. Following treatment and removal from the oven and bottles, the cleaned foils were rinsed with copious amounts of distilled water and dried in a drying oven for about 1 hour and then permitted to cool to room temperature, and then the etch rate determined based on weight loss or weight change.

TABLE 10

| Composition From Tables 1 to 6 | Al Etch Rate at 45° C. (Å/min) | Al Etch Rate at 65° C. (Å/min) | Cu Etch Rate at 45° C. (Å/min) | Cu Etch Rate at 65° C. (Å/min) |
|---|---|---|---|---|
| V | 6 | 39 | | |
| W | 3 | 12 | | |
| Y | 8 | 39 | | |
| Z | 21 | 70 | | |
| AA | 9 | 18 | | |
| BB | | 20 | | |
| CC | | 19 | | |
| DD | | 29 | | |
| II | | | | 3 |
| EE | | | | 8 |
| JJ | | | | <1 |
| KK | | | | <1 |
| LL | | | | 1.2 |
| MM | | | | 2.6 |
| Hydroxylamine based Stripper (EKC-265) | Compatible | Compatible | Non-compatible | Non-compatible |

The interlayer dielectric (ILD) etch rates for Compositions JJ and NN (Table 6) of this invention against various dielectrics were evaluated by the following test procedure.

The film thickness of the wafer pieces is measured using a Rudolph Interferometer. The wafer pieces (with ILD material deposited on silicon wafers) were immersed in the designated cleaning compositions at the indicated temperature for 30 minutes, followed by rinsing with de-ionized water and drying under nitrogen flow/stream. The thickness was then measured again following the treatment and the etch rates were then calculated based on the change in film thickness, which are produced by the indicated treatments.

The IDL etch rates were as follows for Composition JJ (Table 11), Composition NN (Table 12), Composition HH (Table 13), Composition FF (Table 14) and Composition GG (Table 15).

TABLE 11

| Dielectric | Etch Rate @70° C. (Å/min) |
|---|---|
| Carbon doped oxide (CDO) | <1 |
| Silicon nitride (SiN) | <1 |
| Tetraethylorthosilicate (pTEOS) | <1 |
| SiLK ™ organic polymer | <1 |
| Fluorinated silicate glass (FSG) | <1 |
| FOx-16 ™ flowable oxide | <1 |
| Coral ™ carbon doped oxide | 3 |
| Black Diamond ™ carbon doped oxide | 9.5 |

TABLE 12

| Dielectric | Etch Rate @70° C. (Å/min) |
|---|---|
| Carbon doped oxide (CDO) | <1 |
| Silicon nitride (SiN) | <1 |
| Tetraethylorthosilicate (pTEOS) | <1 |
| SiLK ™ organic polymer | <1 |

TABLE 13

| Dielectric | Etch Rate @60° C. (Å/min) |
|---|---|
| Carbon doped oxide (CDO) n = 1.40 | <1 |
| Silicon nitride (SiN) n = 2.0 | 3 |
| Tetraethylorthosilicate (pTEOS) n = 1.46 | 1 |
| SiLK ™ organic polymer n = 1.63 | <1 |

TABLE 14

| Dielectric | Etch Rate @60° C. (Å/min) |
|---|---|
| Carbon doped oxide (CPO) n = 1.40 | <1 |
| Silicon nitride (SiN) n = 2.0 | 2 |
| Tetraethylorthosilicate (pTEOS) n = 1.46 | 1 |
| SiLK ™ organic polymer n = 1.63 | <1 |

TABLE 15

| Dielectric | Etch Rate @60° C. (Å/min) |
|---|---|
| Carbon doped oxide (CPO) n = 1.40 | <1 |
| Silicon nitride (SiN) n = 2.0 | 2 |
| Tetraethylorthosilicate (pTEOS) n = 1.46 | 1 |
| SiLK ™ organic polymer n = 1.63 | <1 |

The cleaning capability of compositions of this invention is illustrated by the following tests in which a microelectronic structure that comprised a wafer of the following structure, namely photoresist/carbon doped oxide/silicon nitride/copper with the silicon nitride punched through to expose copper, was immersed in cleaning solutions for the indicated temperature and time, were then water rinsed, dried and the cleaning determined by SEM inspection. The results are set forth in Table 16.

TABLE 16

| | Composition | | |
|---|---|---|---|
| | G | H | OO |
| Cleaning conditions and results | 35° C./30 min 100% clean | 55° C./20 min 100% clean | 70° C./20 min 100% clean |

The cleaning capability of compositions of this invention is also illustrated by the following tests in which a microelectronic structure that comprised an aluminum wafer of the following structure, namely TiN/Al/TiN/Ti/Si, was immersed in cleaning solutions for the indicated temperature and time, were then water rinsed, dried and the cleaning determined by SEM inspection. The results are set forth in Table 17

TABLE 17

| | Composition VV |
|---|---|
| Cleaning conditions and results | 55° C./20 min 100% clean with perfect substrate compatibility |

The aluminum etch rate for cleaning compositions of this invention are also demonstrated by the etch rate data in the following Table 18. The etch rate was determined utilizing the following test procedure.

Pieces of aluminum foil of approximately 13×50 mm were employed. The thickness of the foil pieces was measured. After cleaning the foil pieces with 2-propanol, distilled water and acetone and the foil pieces are dried in a drying oven. The cleaned, dried foil pieces were then placed in loosely capped bottles of preheated cleaning compositions of the invention and placed in a vacuum oven for a period of from two to four hours at the indicated temperature. Following treatment and removal from the oven and bottles, the cleaned foils were rinsed with copious amounts of distilled water and dried in a drying oven for about 1 hour and then permitted to cool to room temperature, and then the etch rate determined based on weight loss or weight change.

TABLE 18

| Composition From Tables 7 and 8 | Al Etch Rate at 45° C. (Å/min) |
|---|---|
| VV | 3 |
| WW | 21 |
| XX | 9 |
| YY | 6 |
| ZZ | 8 |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

I claim:

1. A cleaning composition capable of cleaning photoresist and residues from microelectronic substrates, said cleaning composition consisting essentially of:
   from about 0.1 to about 30% by weight of hydrogen peroxide as an oxidizing agent;
   from about 10 to about 99% by weight of sulfolane as a polar organic solvent having hydrogen bonding capability and minimally or non-reactive with the oxidizing agent;
   from more than 0 to about 30% by weight of an tetramethylammonium hydroxide as an alkaline base;
   0.1 to 5% by weight of trans-1,2-cyclohexanediamine tetraacetic acid as a chelating or metal complexing agent; and
   from about 0.1 to about 98% by weight water.

2. A cleaning composition capable of cleaning photoresist and residues from microelectronic substrates, said cleaning composition consisting essentially of:
   from about 0.1 to about 30% by weight of hydrogen peroxide as an oxidizing agent;

from about 10 to about 99% by weight of sulfolane as a polar organic solvent having hydrogen bonding capability and minimally or non-reactive with the oxidizing agent;

from more than 0 to about 30% by weight of an tetramethylammonium hydroxide as an alkaline base;

0.1 to 5% by weight of ethylenediamine tetra(methylene phosphonic acid) as a chelating or metal complexing agent; and from about 0.1 to about 98% by weight water.

3. A cleaning composition capable of cleaning photoresist and residues from microelectronic substrates, said cleaning composition consisting of:

from about 0.1 to about 30% by weight of hydrogen peroxide as an oxidizing agent;

from about 1 to about 90% by weight of sulfolane as a polar organic solvent having hydrogen bonding capability and minimally or non-reactive with the oxidizing agent;

from more than 0 to about 30% by weight of tetramethylammonium hydroxide as an Alkaline base;

0.1 to 5% by weight of trans-1,2-cyclohexanediamine tetraacetic acid as a chelating or metal complexing agent; and from about 0.1 to about 98% by weight water.

4. A process for cleaning photoresist or residue from a microelectronic substrate, the process comprising contacting the substrate with a cleaning composition for a time sufficient to clean the photoresist and residue from the substrate, wherein the cleaning composition comprises a composition of claim 1.

5. A process for cleaning photoresist or residue from a microelectronic substrate, the process comprising contacting the substrate with a cleaning composition for a time sufficient to clean the photoresist and residue from the substrate, wherein the cleaning composition comprises a composition of claim 2.

6. A process for cleaning photoresist or residue from a microelectronic substrate, the process comprising contacting the substrate with a cleaning composition for a time sufficient to clean the photoresist and residue from the substrate, wherein the cleaning composition comprises a composition of claim 3.

7. A process according to claim 4 wherein the microelectronic structure being cleaned is characterized by the presence of copper metallization and a dielectric selected from the group consisting of silicon dioxide, a low-κ dielectric and a high-κ dielectric.

8. A process according to claim 5 wherein the microelectronic structure being cleaned is characterized by the presence of copper metallization and a dielectric selected from the group consisting of silicon dioxide, a low-κ dielectric and a high-κ dielectric.

9. A process according to claim 6 wherein the microelectronic structure being cleaned is characterized by the presence of copper metallization and a dielectric selected from the group consisting of silicon dioxide, a low-κ dielectric and a high-κ dielectric.

* * * * *